(12) United States Patent  
Chu et al.

(10) Patent No.: US 10,820,425 B2  
(45) Date of Patent: Oct. 27, 2020

(54) DISPLAY DEVICE AND MANUFACTURING METHOD THEREOF

(71) Applicant: Innolux Corporation, Miao-Li County (TW)

(72) Inventors: Wei-Cheng Chu, Miao-Li County (TW); Chia-Cheng Liu, Miao-Li County (TW); Chih-Yuan Lee, Miao-Li County (TW); Chin-Lung Ting, Miao-Li County (TW); Tong-Jung Wang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/446,653

(22) Filed: Jun. 20, 2019

(65) Prior Publication Data

US 2019/0306990 A1  Oct. 3, 2019

Related U.S. Application Data

(62) Division of application No. 15/917,860, filed on Mar. 12, 2018, now abandoned.

(30) Foreign Application Priority Data

Mar. 14, 2017  (CN) .......................... 2017 1 0150979

(51) Int. Cl.
*H05K 1/00* (2006.01)
*H05K 1/02* (2006.01)
(Continued)

(52) U.S. Cl.
CPC ........... *H05K 3/32* (2013.01); *G02F 1/13452* (2013.01); *H05K 1/028* (2013.01); *H05K 1/111* (2013.01);
(Continued)

(58) Field of Classification Search
CPC .. H05K 1/00; H05K 1/02; H05K 1/18; H05K 3/30; H05K 3/32; H05K 3/36;
(Continued)

(56) References Cited

U.S. PATENT DOCUMENTS 5,194,934 A * 3/1993 Yamazaki .............. H01L 21/563  
257/753  
5,949,502 A * 9/1999 Matsunaga ....... G02F 1/136204  
349/40  
(Continued)

*Primary Examiner* — Xiaoliang Chen  
(74) *Attorney, Agent, or Firm* — JCIPRNET

(57) ABSTRACT

A display device is provided. The display device includes a display panel, a flexible circuit board, an integrated circuit, and a conductive layer. The flexible circuit board is electrically connected with the display panel and includes a plurality of conductive wires. The integrated circuit is disposed on the flexible circuit board and has a plurality of bumps. The conductive layer is disposed between the integrated circuit and the flexible circuit board and covers a periphery of the integrated circuit. In addition, the conductive layer includes an adhesive and a plurality of conductive particles distributed in the adhesive. Moreover, the bumps are electrically connected with the conductive wires through the conductive particles.

7 Claims, 6 Drawing Sheets

(51) Int. Cl.
| | |
|---|---|
| *H05K 1/18* | (2006.01) |
| *H05K 3/30* | (2006.01) |
| *H05K 3/32* | (2006.01) |
| *H05K 3/36* | (2006.01) |
| *H01L 21/02* | (2006.01) |
| *H01L 21/44* | (2006.01) |
| *H01L 23/48* | (2006.01) |
| *H01L 23/498* | (2006.01) |
| *H01J 17/02* | (2006.01) |
| *H01J 17/34* | (2006.01) |
| *H05K 1/11* | (2006.01) |
| *H05K 3/06* | (2006.01) |
| *H05K 1/14* | (2006.01) |
| *G02F 1/1345* | (2006.01) |
| *H05K 3/46* | (2006.01) |

(52) U.S. Cl.
CPC .............. *H05K 1/14* (2013.01); *H05K 1/181* (2013.01); *H05K 1/189* (2013.01); *H05K 3/06* (2013.01); *H05K 3/323* (2013.01); *H05K 3/361* (2013.01); *H05K 3/4644* (2013.01); *G02F 1/13458* (2013.01); *H05K 2201/0367* (2013.01); *H05K 2201/10378* (2013.01); *H05K 2203/0502* (2013.01)

(58) Field of Classification Search
CPC ......... H01L 21/02; H01L 21/44; H01L 23/48; H01L 23/498; H01J 17/02; H01J 17/34
USPC ........ 361/749, 760, 771; 174/254, 260, 545, 174/551, 558; 257/668, 659, 88, 774, 257/797
See application file for complete search history.

(56) References Cited

U.S. PATENT DOCUMENTS

| | | | | |
|---|---|---|---|---|
| 6,057,986 A * | 5/2000 | Takasugi | ................ | G11B 5/486 360/245.9 |
| 6,184,680 B1 * | 2/2001 | Shinoura | ................ | B82Y 25/00 324/207.21 |
| 6,617,521 B1 * | 9/2003 | Saito | ................ | H01L 24/27 174/260 |
| 8,228,677 B2 * | 7/2012 | Kunimatsu | ............ | H05K 1/111 174/254 |
| 8,242,615 B2 * | 8/2012 | Takahashi | ............. | H01L 21/563 257/797 |
| 2001/0033009 A1 * | 10/2001 | Inoue | ................ | H05K 7/20963 257/668 |
| 2002/0050381 A1 * | 5/2002 | Takao | ............... | H01L 23/49838 174/545 |
| 2002/0071085 A1 * | 6/2002 | Huang | ................. | G02F 1/1345 349/149 |
| 2004/0234763 A1 * | 11/2004 | Saito | ..................... | C08G 59/18 428/402.2 |
| 2005/0106382 A1 * | 5/2005 | Kashihara | ................ | H01R 4/04 428/330 |
| 2005/0121805 A1 * | 6/2005 | Matsuzawa | ....... | H01L 23/49838 257/784 |
| 2006/0044505 A1 * | 3/2006 | Nakazawa | .......... | G02F 1/13452 349/150 |
| 2006/0065955 A1 * | 3/2006 | Sakurada | ............ | H05K 3/4647 257/659 |
| 2006/0068616 A1 * | 3/2006 | Shintate | ................ | H05K 3/125 439/76.1 |
| 2007/0036953 A1 * | 2/2007 | Nonaka | .................. | C09J 133/08 428/209 |
| 2007/0036954 A1 * | 2/2007 | Ikishima | ................ | H05K 3/386 428/209 |
| 2009/0008132 A1 * | 1/2009 | Takasawa | ............. | H01L 23/295 174/254 |
| 2010/0321908 A1 * | 12/2010 | Shiota | .................... | H05K 3/323 361/771 |
| 2011/0182046 A1 * | 7/2011 | Shiota | .................... | H05K 3/323 361/760 |
| 2015/0076531 A1 * | 3/2015 | Kim | ...................... | H01L 23/4985 257/88 |
| 2015/0160500 A1 * | 6/2015 | Ikuta | .................... | G02F 1/13452 349/150 |
| 2016/0155730 A1 * | 6/2016 | Yu | ........................ | H01L 21/565 257/774 |

* cited by examiner

DISPLAY DEVICE AND MANUFACTURING METHOD THEREOF

CROSS-REFERENCE TO RELATED APPLICATION

This application is a divisional application of and claims the priority benefit of a prior application Ser. No. 15/917,860, filed on Mar. 12, 2018, now pending. The prior application Ser. No. 15/917,860 claims the priority benefit of China application serial no. 201710150979.4, filed on Mar. 14, 2017. The entirety of each of the above-mentioned patent applications is hereby incorporated by reference herein and made a part of this specification.

BACKGROUND

1. Technical Field

The disclosure relates to a device and a manufacturing method of the device, and particularly relates to a display device and a manufacturing method of the display device.

2. Description of Related Art

With the advantages of liquid crystal display panels, such as being small-sized and having low radiation, liquid crystal display devices have been broadly applied in various electronic products. In order to display an image, a liquid crystal display device requires an integrated circuit (IC) to drive the liquid crystal display panel. The ICs in the conventional liquid crystal display devices are mostly bonded with the liquid crystal display panels by means of the technique of chip on film (COF). In a conventional COF process, an IC is normally soldered to a flexible printed circuit board (FPCB) by performing high-temperature lead-tin soldering, and then the FPCB is integrated with the liquid crystal display panel. Thus, in a conventional manufacturing process of the liquid crystal display device, the FPCB encapsulating the IC is normally acquired through purchasing. Therefore, the limited specification of the FPCB makes the FPCB difficult to integrate and increasing the manufacturing cost.

SUMMARY

The disclosure provides a display device and a manufacturing method of the display device to cope with the issues in the prior art.

A display device according to an embodiment of the disclosure includes a display panel, a flexible circuit board, an integrated circuit, and a conductive layer. The flexible circuit board is electrically connected with the display panel and includes a plurality of conductive wires. The integrated circuit is disposed on the flexible circuit board and has a plurality of bumps. The conductive layer is disposed between the integrated circuit and the flexible circuit board and covers a periphery of the integrated circuit. In addition, the conductive layer includes an adhesive and a plurality of conductive particles distributed in the adhesive. Moreover, the bumps are electrically connected with the conductive wires through the conductive particles.

A display device according to an embodiment of the disclosure includes a display panel, a flexible circuit board, and an integrated circuit. The flexible circuit board is electrically connected with the display panel and includes a plurality of conductive wires. In addition, a thickness of at least one of the conductive wires is less than or equal to 3 µm, at least one of the conductive wires includes an extending portion with a width in a range from 1 µm to 7 µm. The integrated circuit is disposed on the flexible circuit board. Moreover, the integrated circuit has a plurality of bumps electrically connected with the conductive wires.

A manufacturing method of a display device according to an embodiment of the disclosure includes steps as follows: providing a flexible circuit board including a plurality of conductive wires manufactured by performing a thin-film photolithography process, wherein a thickness of at least one of the conductive wires is less than or equal to 3 µm, the at least one of the conductive wires includes an extending portion with a width in a range from 1 µm to 7 µm; electrically connecting the flexible circuit board and a display panel; electrically connecting the flexible circuit board and an integrated circuit.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
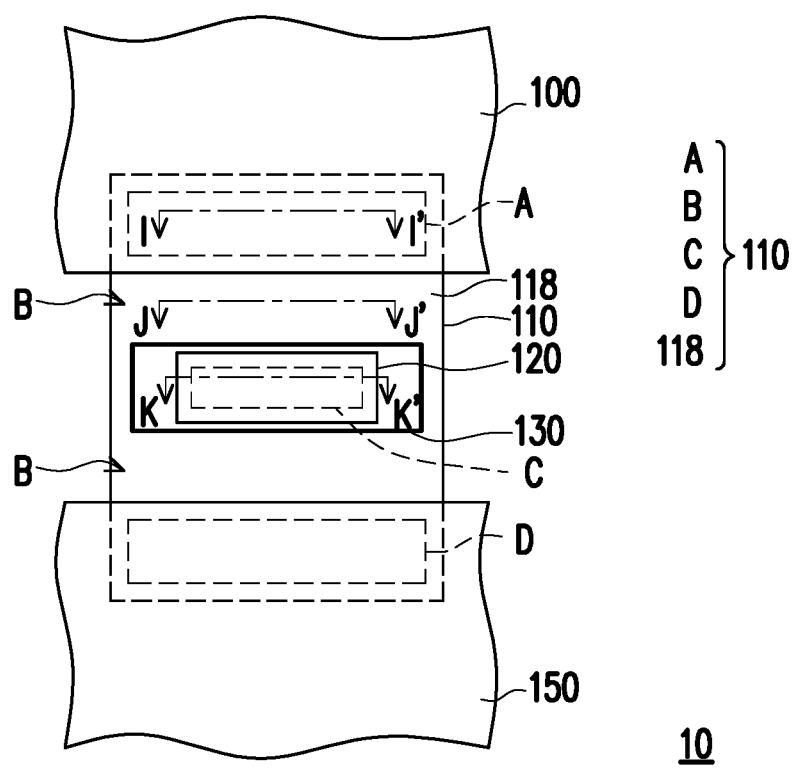
FIG. 1 is a schematic top view illustrating a display device according to an embodiment of the disclosure.

In the disclosure, wherever possible, identical or similar reference numerals serve to refer to identical or similar components in the drawings and descriptions.

In the disclosure, the description that a structure is formed on or above another structure may include an embodiment where the structure and the another structure directly contact each other as well as an embodiment where an additional structure is formed between the structure and the another structure so the structure and the another structure do not directly contact each other.

Figure 2:
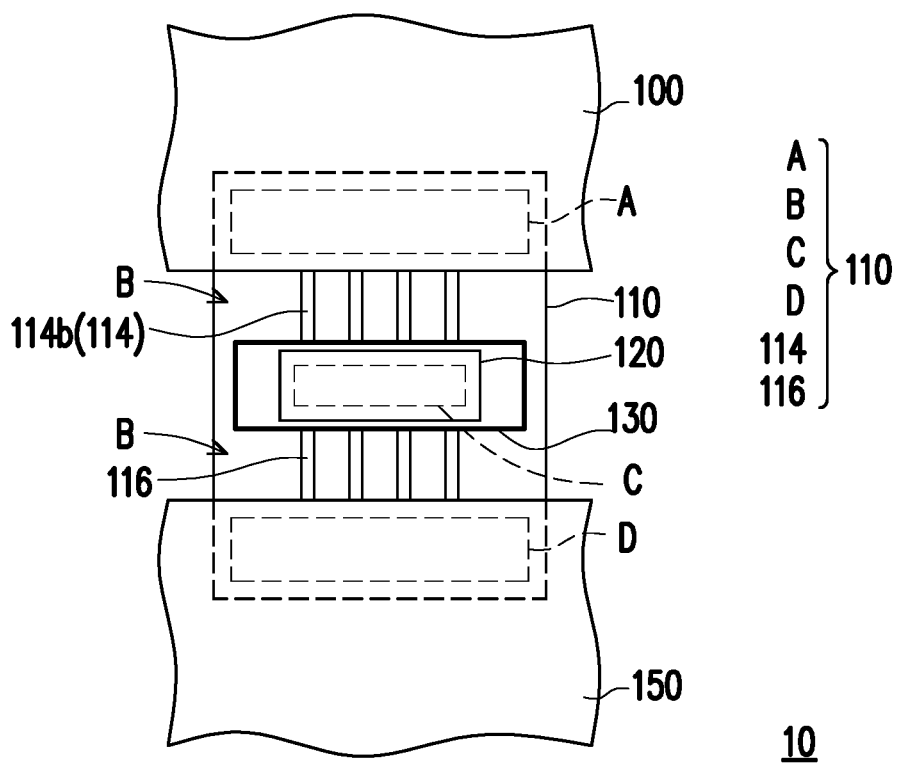
FIG. 2 is a schematic top view illustrating the display device of FIG. 1 omitting an insulating layer.
Figure 3:
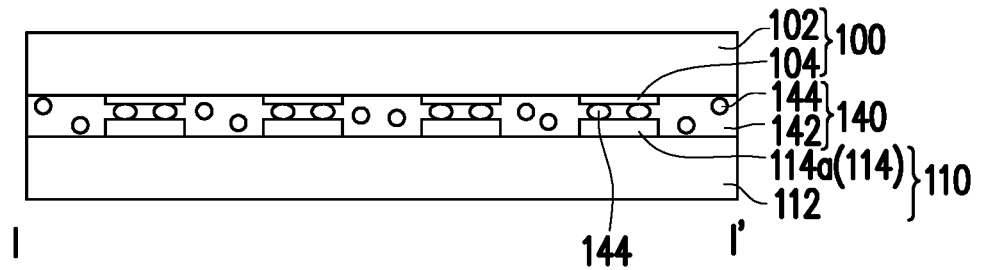
FIG. 3 is a schematic cross-sectional view along a cross-sectional line I-I' of FIG. 1.
Figure 4:
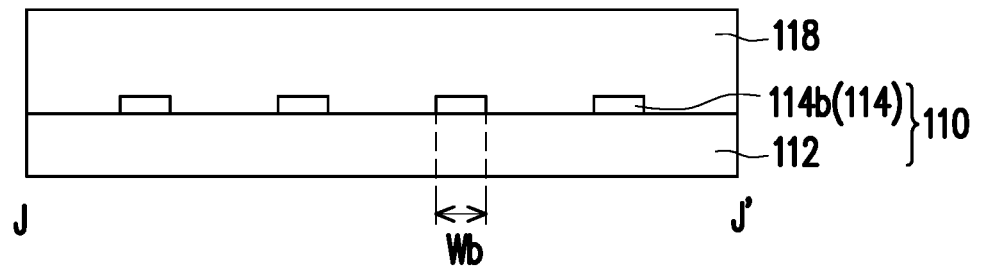
FIG. 4 is a schematic cross-sectional view along a cross-sectional line J-J' of FIG. 1.
Figure 5:
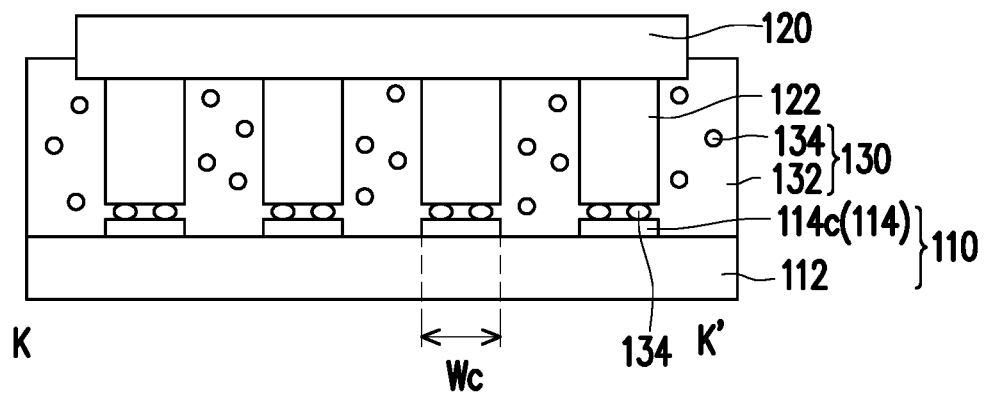
FIG. 5 is a schematic cross-sectional view along a cross-sectional line K-K' of FIG. 1.

FIG. 1 is a schematic top view illustrating a display device according to an embodiment of the disclosure. FIG. 2 is a schematic top view illustrating the display device of FIG. 1 omitting an insulating layer. FIG. 3 is a schematic cross-sectional view along a cross-sectional line I-I' of FIG. 1. FIG. 4 is a schematic cross-sectional view along a cross-sectional line J-J' of FIG. 1. FIG. 5 is a schematic cross-sectional view along a cross-sectional line K-K' of FIG. 1.

Referring to FIGS. 1 to 5 at the same time, a display device 10 may include a display panel 100, a flexible circuit board 110, an integrated circuit 120, a conductive layer 130, a conductive layer 140, and a printed circuit board (PCB) 150. In the present embodiment, the display device 10 may be a liquid crystal (LC) display device, an inorganic light emitting diode (LED) display device, an organic light emitting diode (OLED) display device, a mini light emitting diode (mini LED) display device, a micro light emitting diode (micro LED) display device, a quantum dot (QD) display device, a flexible display device, a touch display device or a curved surface display device. However, the disclosure is not limited thereto. Also, the display panel 100 may be a liquid crystal display panel, an inorganic light emitting diode (LED) display panel, an organic light emitting diode display panel, a mini light emitting diode (mini LED) display device, a micro light emitting diode display panel, a quantum dot display panel, a touch display panel, or a curved surface display panel. In examples, the chip size of the light-emitting diode is in a range from about 300 µm to 10 mm, the chip size of the mini light-emitting diode is in a range from about 100 µm to 300 µm, and the chip size of the micro light-emitting diode is in a range from about 1 µm to 100 µm. Nevertheless, the disclosure is not limited thereto. Specifically, in the present embodiment, the display panel 100 may be any kind of liquid crystal display panel known by people having ordinary skills in the art. As shown in FIG. 3, in the present embodiment, the display panel 100 at least includes a substrate 102 and a plurality of pads 104 disposed on the substrate 102. The material of the substrate 102 may include glass, quartz, an organic polymer, or metal, etc. In practice, in a case when the material of the substrate 102 includes an organic polymer, the organic polymer may include (but is not limited to) polyimide (PI), polyethylene terephthalate (PET), or polycarbonate (PC), etc.

In the present embodiment, the printed circuit board 150 may be any kind of printed circuit board known by people having ordinary skills in the art, such as a flexible printed circuit board or a rigid printed circuit board.

In the present embodiment, the integrated circuit 120 may be any kind of integrated circuit known by people having ordinary skills in the art. As shown in FIG. 5, in the present embodiment, the integrated circuit 120 at least has a plurality of bumps 122. The material of the bump 122 may include a conductive metal, such as (but is not limited to) gold, copper, or aluminum.

In the present embodiment, the flexible circuit board 110 may include a display panel bonding area A, a wiring area B, an integrated circuit bonding area C, and a printed circuit board bonding area D. In addition, the wiring area B is located at a side of the display panel bonding area A and a side of the printed circuit board bonding area D, and the wiring area B surrounds the integrated circuit bonding area C. In the present embodiment, the flexible circuit board 110 may include a flexible substrate 112 and a plurality of conductive wires 114, a plurality of conductive wires 116, and an insulating layer 118 disposed on the flexible substrate 112. In the present embodiment, the material of the flexible substrate 112 may include (but is not limited to) polyimide (PI), polyethylene terephthalate (PET), or polycarbonate (PC), etc.

In the present embodiment, the material of at least one of the conductive wires 114 includes, for example, a conductive material including (but not limited to) a conductive metal, such as aluminum, copper, titanium, molybdenum, gold, silver, nickel, or an alloy thereof; or a metal oxide such as indium-tin-oxide (ITO), indium zinc oxide (IZO), aluminum tin oxide (ATO), aluminum zinc oxide (AZO), or indium gallium zinc oxide (IGZO). In the present embodiment, the thickness of at least one of the conductive wires 114 is less than or equal to 3 µm. In the present embodiment, the conductive wires 114 extend from the integrated circuit bonding area C to the display panel bonding area A through the wiring area B. Namely, the conductive wires 114 are located in the integrated circuit bonding area C, the wiring area B, and the display panel bonding area A. Specifically, in the present embodiment, the conductive wires 114 include a display panel pad portion 114a, an integrated circuit pad 114c, and an extending portion 114b connecting the display panel pad portion 114a to the integrated circuit pad 114c. It should be noted that as long as at least one of the conductive wires 114 includes the display panel pad portion 114a, the integrated circuit pad 114e, and the extending portion 114b, the above falls within the scope of the present disclosure. More specifically, in the present embodiment, as shown in FIG. 3, the display panel pad portion 114a is located in the display panel bonding area A and corresponds to the pads 104 of the display panel 100, and as shown in FIG. 5, the integrated circuit pad 114e is located in the integrated circuit bonding area C and corresponds to the bumps 122 of the integrated circuit 120. Specifically, in an embodiment, a width We or a width Wb is in a range from 1 µm to 40 µm. In another embodiment, the width Wb is in a range from 1 µm to 7 µm. In another embodiment, the width Wb is 5 µm. In another embodiment, the width We is in a range from 3 µm to 20 µm. In another embodiment, the width We is 15 µm.

In the present embodiment, the conductive wires 116 extend from the integrated circuit bonding area C to the printed circuit board bonding area D through the wiring area B. Namely, the conductive wires 116 are located in the integrated circuit bonding area C, the wiring area B, and the printed circuit board bonding area D. It should be noted that, based on the descriptions about the conductive wires 114, people having ordinary skills in the art shall understand relevant details about the material, the structure, and the arrangement of the conductive wires 116. In other words, the material, the structure, and the arrangement of the conductive wires 116 may be the same as those of the conductive wires 114. Besides, even though the embodiment in FIGS. 1 to 5 shows that the number of each of the conductive wires 114 and the conductive wires 116 is four, the disclosure is not limited thereto. In other embodiments, the numbers, the widths, the pitches, or the shapes of the conductive wires 114 and the conductive wires 116 may be adjusted based on the practical needs of the display device.

In the embodiment, the insulating layer 118 is disposed in the wiring area B, and the insulating layer 118 covers the conductive wires 114 and the conductive wires 116. Accordingly, the insulating layer 118 is able to protect the conductive wires 114 and the conductive wires 116 from being damaged by moisture. Specifically, in the present embodiment, the material of the insulating layer 118 may include a moisture-proof insulating material, such as (but is not limited to): a photoresist, a solder resist, $AlN_x$, $SiO_x$, or $SiN_x$. Besides, in the present embodiment, the insulating layer 118 is not disposed in the integrated circuit bonding area C, the display panel bonding area A, and the printed circuit bonding area D. Accordingly, the display panel pad portion 114a and the integrated circuit pad 114c are not covered by the insulating layer 118 and are exposed.

In the present embodiment, the conductive layer 130 is disposed between the integrated circuit 120 and the flexible circuit board 110. In the present embodiment, the conductive layer 130 covers the periphery of the integrated circuit 120. However, the disclosure is not limited thereto. Besides, in the present embodiment, the conductive layer 130 includes an adhesive 132 and a plurality of conductive particles 134 distributed in the adhesive 132. As shown in FIG. 5, in the present embodiment, the bumps 122 of the integrated circuit 120 are electrically connected with the integrated circuit pads 114c of the conductive wires 114 through the conductive particles 134, and the integrated circuit 120 is adhered to the flexible circuit board 110 through the adhesive 132. In other words, the conductive layer 130 serves to electrically and physically connect the integrated circuit 120 and the flexible circuit board 110. More specifically, in the present embodiment, the integrated circuit 120 and the flexible circuit board 110 are electrically connected because the conductive particles 134 between the bumps 122 and the integrated circuit pads 114c are pressed and deformed, thereby being electrically conductive. Accordingly, in the embodiment, gaps are provided between the bumps 122 and the integrated circuit pads 114c, and each of conductive paths between the bumps 122 and the integrated circuit pads 114c may be discontinuous. In other embodiments, each of the conductive paths between the bumps 122 and the integrated circuit pads 114c may be partially continuous. In the present embodiment, a conductive path may be a path that one of the bumps 122 is electrically connect with one of the integrated circuit pads 114c through one of the conductive particles 134. When the conductive particles 134 discontinuously (or separately) disposed between the bumps 122 and the integrated circuit pads 114c, the conductive paths may be discontinuous. However, the disclosure is not limited thereto. Specifically, in the present embodiment, the conductive layer 130 may be an anisotropic conductive film (ACF). The material of the adhesive 132 may include (but is not limited to) a thermosetting polymer material or a thermoplastic polymer material, for example. The material of the conductive particles 134 may include (but is not limited thereto) gold, nickel, tin, or palladium, for example.

Besides, in the present embodiment, even though FIG. 5 illustrates that the integrated circuit pads 114c and the bumps 122 have the same width, the disclosure is not limited thereto. In other embodiments, the integrated circuit pads 114c and the bumps 122 may have different widths. For example, in an embodiment, the width of the integrated circuit pads 114c may be greater than the width of the bumps 122. As another example, in an embodiment, the width of the integrated circuit pads 114c may be smaller than the width of the bumps 122. In the present embodiment, even though FIG. 5 illustrates that the integrated circuit pads 114c and the bumps 122 are aligned to each other, the disclosure is not limited thereto. In other embodiments, the integrated circuit pads 114c and the bumps 122 may have the same width, but the positions of the integrated circuit pads 114c and the bumps 122 are staggered or deviated, or the integrated circuit pads 114c and the bumps 122 may have different widths, and the positions of the integrated circuit pads 114c and the bumps 122 are staggered or deviated.

In the present embodiment, the conductive layer 140 is disposed between the display panel 100 and the flexible circuit board 110. In the present embodiment, the conductive layer 140 includes an adhesive 142 and a plurality of conductive particles 144 distributed in the adhesive 142. As shown in FIG. 3, in the present embodiment, the pads 104 of the display panel 100 are electrically connected with the display panel pad portions 114a of the conductive wires 114 through the conductive particles 144, and the display panel 100 is adhered to the flexible circuit board 110 through the adhesive 142. In other words, the conductive layer 140 is able to electrically and physically connect the display panel 100 and the flexible circuit board 110. More specifically, in the embodiment, the display panel 100 and the flexible circuit board 110 are electrically connected because the conductive particles 144 between the pads 104 and the display panel pad portions 114a are pressed and deformed, thereby being electrically conductive. However, the disclosure is not limited thereto. Specifically, in the present embodiment, the conductive layer 140 may be an anisotropic conductive film (ACF). The material of the adhesive 142 may include (but is not limited to) a thermosetting polymer material or a thermoplastic polymer material, for example. The material of the conductive particles 144 may include (but is not limited thereto) gold, nickel, tin, or palladium, for example.

From another perspective, in the present embodiment, the display panel 100 and the integrated circuit 120 may be electrically connected with each other through the flexible circuit board 110. In the present embodiment, the flexible circuit board 110 may be a chip-on-film (COF). In other words, the integrated circuit 120 in the display device 10 may be electrically connected with the display panel 100 by means of COF.

In addition, based on the descriptions about the connection between the integrated circuit 120 and the flexible circuit board 110 through the conductive wires 114 and the connection between the display panel 100 and the flexible circuit board 110 through the conductive wires 114, people having ordinary skills in the art shall understand the connection between the integrated circuit 120 and the flexible circuit board 110 through the conductive wires 116 and the connection between the printed circuit board 150 and the flexible circuit board 110 through the conductive wires 116. In other words, in the present embodiment, the bumps 122 of the integrated circuit 120 are also electrically connected with the integrated circuit pads of the conductive wires 116 through the conductive particles 134, and the pads of the printed circuit board 150 are also electrically connected with the display panel pad portions of the conductive wires 116 through the conductive particles.

It should be noted that the integrated circuit 120, the flexible circuit board 110, the printed circuit board 150, and the display panel 100 are electrically connected with each other, as mentioned above. The bumps 122 of the integrated circuit 122 may transmit a signal received from the printed circuit board 150 into the integrated circuit 120 for signal processing, and then transmit the processed signal to the display panel 100. Accordingly, sub-pixels (e.g., red, green, and blue sub-pixels) in the display panel 100 may display correct levels of color.

Besides, based on the descriptions about FIGS. 1 to 5, people having ordinary skills in the art shall understand that the integrated circuit 120 may also be electrically connected with the conductive wires 116 through a conductive layer, the printed circuit board 150 may also be electrically connected with the flexible circuit board 110 through a conductive layer, and the printed circuit board 150 and the integrated circuit 120 may also be electrically connected with each other through the flexible circuit board 110.

It is noteworthy that, in the display device 10 of the present embodiment, the bumps 122 of the integrated circuit 120 are electrically connected with the conductive wires 114 of the flexible circuit board 110 through the conductive particles 134 in the conductive layer 130. Thus, a process of bonding the integrated circuit 120 and the flexible circuit board 110 may be performed based on a manufacturing technique for manufacturing the display panel 100, and a process of high-temperature lead-tin soldering is thus not required to bond the integrated circuit and the flexible circuit board.

Moreover, in the display device 10 of the embodiment, the conductive wires 114 may have the thickness less than or equal to 3 μm, and the extending portions 114b of the conductive wires 114 may have the width in a range from 1 μm to 7 μm. Accordingly, compared with the conventional flexible circuit board, the display device 10 is more applicable to a small-sized electronic device or a high-resolution display device.

Generally speaking, in a conventional COF process, a conductive wire is manufacturing by electroplating. Thus, the thickness and the width of the conductive wire are limited. The thickness of the conductive wire manufactured by electroplating is in a range from about 6 μm to 10 μm, and the width of the conductive wire manufactured by electroplating is approximately equal to or greater than 10 μm. It should be noted that, in the present embodiment, the conductive wires 114 are manufactured by performing a thin-film photolithography process. Thus, the thickness and the width of the conductive wires 114 may be reduced. The conductive wires 114 may have the thickness smaller than or equal to 3 μm and the width in a range from 1 μm to 7 μm. In the following, a manufacturing method of the display device 10 is described.

In the embodiment, the manufacturing method of the display device 10 may include steps as follows. The flexible circuit board 110 is provided. The flexible circuit board 110 is electrically connected with the integrated circuit 120. The flexible circuit board 110 and the display panel 100 are electrically connected. The flexible circuit board 110 and the printed circuit board 150 are electrically connected.

First, the step of providing the flexible circuit board 110 is described with reference to FIGS. 6A to 6D. FIGS. 6A-6D are cross-sectional views illustrating a manufacturing method, and the cross-sectional views are taken along the cross-sectional line J-J' of FIG. 1.

Figure 6A:
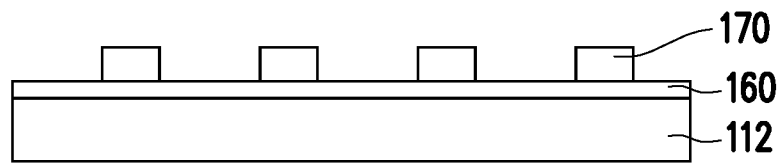
FIGS. 6A-6D are cross-sectional views illustrating a manufacturing method, and the cross-sectional views are taken along the cross-sectional line J-J' of FIG. 1.

First, referring to FIG. 6A, a conductive wire material layer 160 is formed on the flexible substrate 112. Specifically, a process of forming the conductive wire material layer 160 may include (but is not limited to) performing a sputtering process or a metal organic chemical vapor deposition (MOCVD) process, for example. In the present embodiment, the material of the conductive wire material layer 160 includes, for example, a conductive material including (but not limited to) a conductive metal, such as aluminum, copper, titanium, molybdenum, gold, silver, nickel, or an alloy thereof; or a metal oxide such as indium-tin-oxide (ITO), indium zinc oxide (IZO), aluminum tin oxide (ATO), aluminum zinc oxide (AZO), or indium gallium zinc oxide (IGZO).

Then, a patterned photoresist layer 170 is formed on the conductive wire material layer 160. Specifically, in the present embodiment, a process of forming the patterned photoresist layer 170 may include steps as follows: after forming a photoresist layer (not shown) on the conductive wire material layer 160, sequentially performing an exposure process and a development process. A process of forming the photoresist layer may include (but is not limited to) performing a wet coating process, such as spin coating, roll coating, blade coating, slide coating, slot-die coating, or wire bar coating.

Figure 6B:
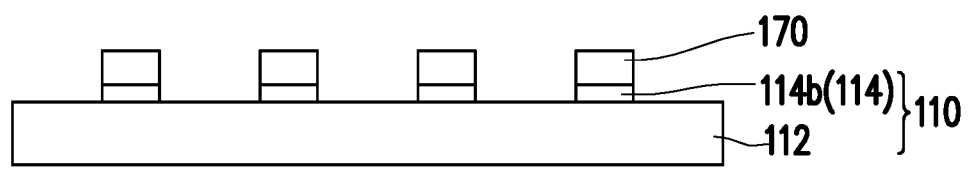

Then, referring to FIG. 6B, using the patterned photoresist layer 170 as a mask, a portion of the conductive wire material layer 160 is removed to form the extending portions 114b of the conductive wires 114. It should be noted that, while FIG. 6B only illustrates a cross-sectional view along the cross-sectional line J-J', people having ordinary skills in the art shall understand based on the descriptions of FIGS. 1 to 5 that the display panel pad portions 114a and the integrated circuit pads 114c are also formed when the extending portions 114b are formed. In other words, at the step shown in FIG. 6B, the conductive wires 114 are formed on the flexible substrate 112. Besides, in the present embodiment, a process of removing a portion of the conductive wire material layer 160 may include (but is not limited to) performing a wet etching process, a dry etching process, or a combination thereof.

Figure 6C:

Then, referring to FIG. 6C, the patterned photoresist layer 170 is removed.

Specifically, in the present embodiment, a process of removing the patterned photoresist layer 170 may include (but is not limited to) performing a wet-type process adopting a peeling solution, or a dry-type process adopting plasma ashing.

Figure 6D:
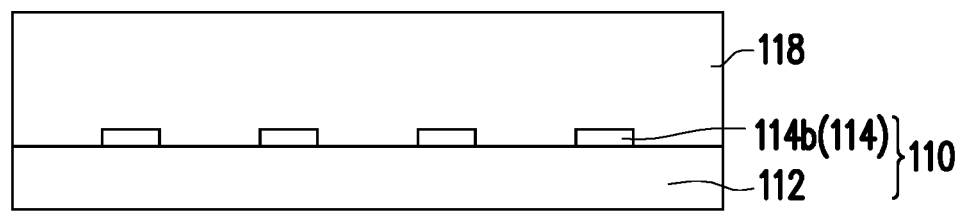

Then, referring to FIG. 6D, the insulating layer 118 is formed on the flexible substrate 112. Specifically, in the present embodiment, a process of forming the insulating layer 118 may include (but is not limited to) performing a wet coating process, such as spin coating, roll coating, blade coating, slide coating, slot-die coating, or wire-bar coating.

Besides, based on the descriptions of FIGS. 1 to 5, people having ordinary skills in the art shall understand that, before forming the insulating layer 118 on the flexible substrate 112, the conductive wires 116 are formed on the flexible substrate 112, and the insulating layer 118 is disposed on a portion of the conductive wires 116. More specifically, based on the descriptions of FIGS. 1 to 5 and FIGS. 6A to 6C, people having ordinary skills in the art shall understand a process of forming the conductive wires 116 on the flexible substrate 112.

Figure 7A:
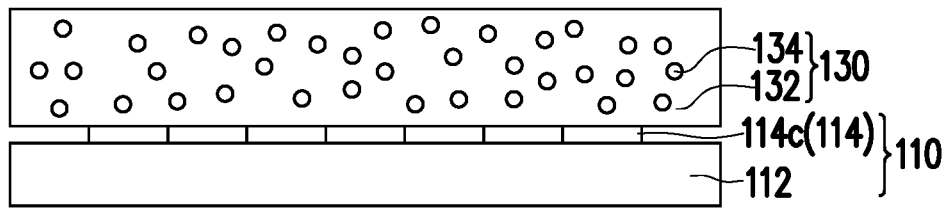
FIGS. 7A-7C are cross-sectional views illustrating a manufacturing method, and the cross-sectional views are taken along the cross-sectional line K-K' of FIG. 1.
Figure 7B:
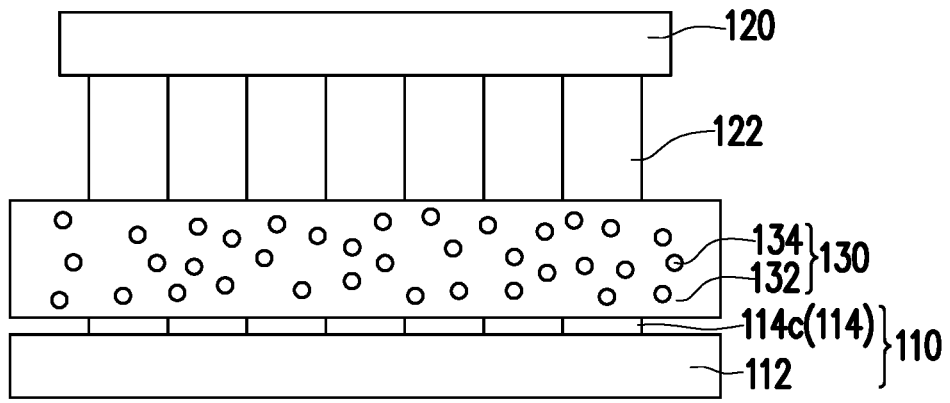
Figure 7C:
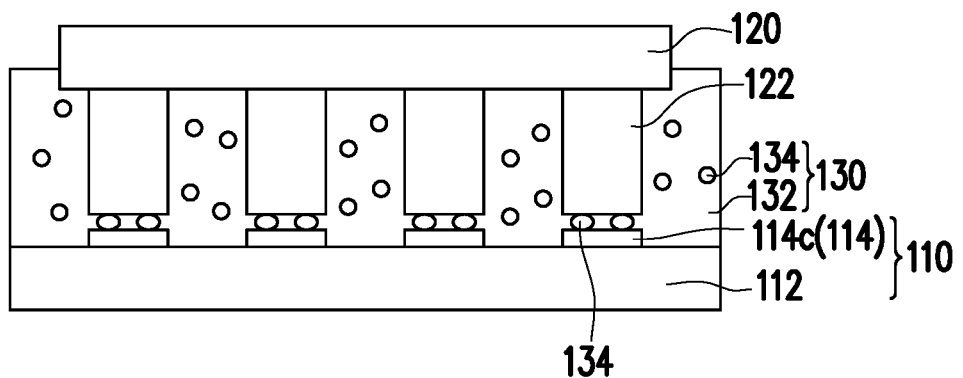

Then, the step of electrically connecting the flexible circuit board 110 and the integrated circuit 120 is described with reference to FIGS. 7A to 7C. FIGS. 7A-7C are cross-sectional views illustrating a manufacturing method, and the cross-sectional views are taken along the cross-sectional line K-K' of FIG. 1.

First of all, referring to FIG. 7A, the conductive layer 130 is disposed on the integrated circuit pads 114c of the conductive wires 114 in the integrated circuit bonding area C.

Specifically, in the embodiment, a process of disposing the conductive layer 130 on the integrated circuit pads 114c includes attaching the conductive layer 130 on the integrated circuit pads 114c, for example.

Then, referring to FIG. 7B, a pre-bonding process is performed to pre-align the flexible circuit board 110 with the integrated circuit 120. Specifically, in the embodiment, when the pre-bonding process is performed, since the adhesive 132 in the conductive layer 130 is adhesive, the integrated circuit 120 may be pre-bonded to the flexible circuit board 110 through the conductive layer 130.

Then, referring to FIG. 7C, a thermal compression process is performed to fix the conductive layer 130 between the flexible circuit board 110 and the integrated circuit 120. Specifically, in the embodiment, a condition of temperature of the thermal compression process is in a range from 100° C. to 200° C., for example, and a condition of pressure of the thermal compression process is in a range from 10 MPa to 120 MPa, for example. After being soldered to the chip-on-film through high-temperature lead-tin soldering, an underfill also needs to be additionally disposed to the conventional integrated circuit to reinforce bonding between the integrated circuit and the chip-on-film and to block moisture or an external object, so as to protect the bumps and the integrated circuit pads. In the embodiment, after the thermal compression process, the conductive layer 130 may surround the periphery of the integrated circuit 120 to cover the bumps 122 and the integrated circuit pads 114c of the integrated circuit 120. Accordingly, while the high-temperature lead-tin soldering and the underfill are not required to be disposed between the flexible circuit board 110 and the integrated circuit 120 in the embodiment, the electrical connection, reinforcement of bonding, and blocking of moisture and external object can still be achieved.

Then, referring to FIGS. 1 and 3, the flexible circuit board 110 and the display panel 100 are electrically connected. Based on the descriptions about FIG. 3, it can be known that the flexible circuit board 110 and the display panel 100 are electrically connected through the conductive layer 140. Therefore, based on the descriptions about FIGS. 7A to 7C, people having ordinary skills in the art shall understand how the flexible circuit board 110 and the display panel 100 are electrically connected.

Then, referring to FIG. 1, the flexible circuit board 110 and the printed circuit board 150 are electrically connected. Based on the descriptions about FIGS. 1 to 5 and FIGS. 7A to 7C, people having ordinary skills in the art shall understand how the flexible circuit board 110 and the printed circuit board 150 are electrically connected.

It should be noted that, in the manufacturing method of the display device 10, the conductive wires 114 of the flexible circuit board 110 are manufactured by performing a thin-film photolithography process. Therefore, the flexible circuit board 110 can be manufactured by using a processing technique commonly used in the manufacture of the display panel 100, and therefore the flexible circuit board 110 is not required to be additionally purchased. Thus, compared with the conventional display device requiring additionally purchasing the flexible circuit board during the manufacturing process, the display device 10 is more flexible in manufacturing and has a lower manufacturing cost.

Besides, even though the manufacturing method of the display device 10 is described with the following order: electrically connecting the flexible circuit board 110 and the integrated circuit 120, electrically connecting the flexible circuit board 110 and the display panel 100, and electrically connecting the flexible circuit board 110 and the printed circuit board 150, the disclosure is not limited by the order. In other words, the manufacturing method of the display device 10 of the disclosure is not limited by the aforementioned order, and the order among electrically connecting the flexible circuit board 110 and the integrated circuit 120, electrically connecting the flexible circuit board 110 and the display panel 100, and electrically connecting the flexible circuit board 110 and the printed circuit board 150 is variable.

As shown in FIGS. 4 and 5, the width We of the integrated circuit pads 114c is greater than the width Wb of the extending portions 114b in the embodiment. In the following, a structural relation between the integrated circuit pads 114c and the extending portions 114b is described in greater detail with reference to FIG. 8.

Figure 8:
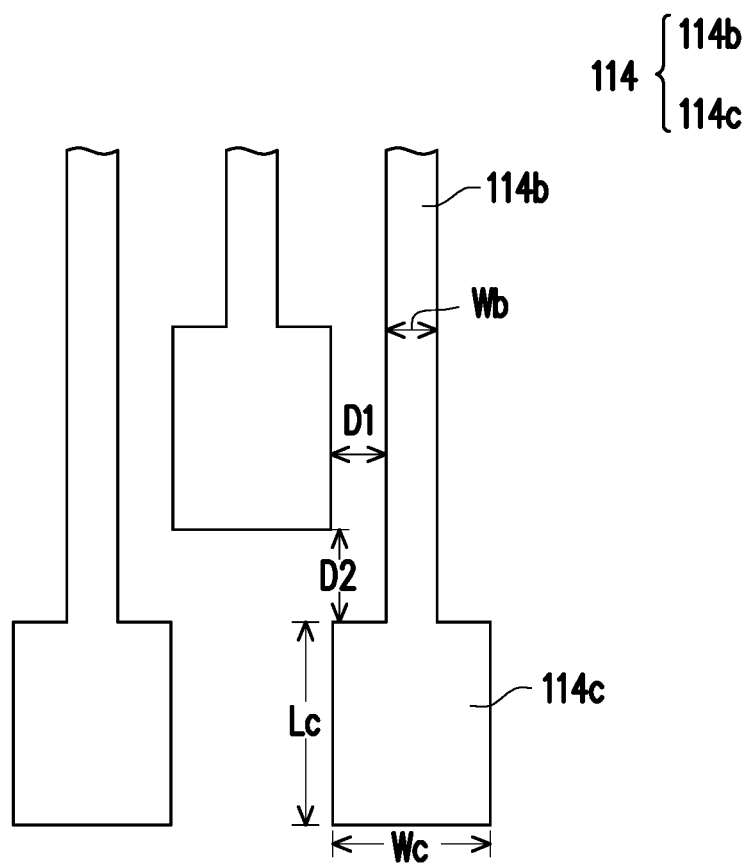
FIG. 8 is a partial schematic top view illustrating conductive wires of FIG. 2.

FIG. 8 is a partial schematic top view illustrating conductive wires of FIG. 2. It should be noted that FIG. 8 correspondingly illustrates a portion of the conductive wires 114 corresponding to the wiring area B and the integrated circuit bonding area C.

Referring to FIG. 8, the width We of the integrated circuit pads 114e is greater than the width Wb of the extending portions 114b. Specifically, in an embodiment, the width We of the integrated circuit pads 114e is in a range from 1 μm to 40 μm. In another embodiment, the width We of the integrated circuit pads 114e is in a range from 3 μm to 20 μm. In another embodiment, the width We of the integrated circuit pads 114e is 15 μm. Also, in an embodiment, a length Le of the integrated circuit pads 114e is in a range from 1 μm to 60 μm. In another embodiment, the length Le of the integrated circuit pads 114c is in a range from 3 μm to 50 μm. In yet another embodiment, the length Le of the integrated circuit pads 114e is 40 μm. Furthermore, in an embodiment, the width Wb of the extending portions 114b is in a range from 1 μm to 40 μm. In another embodiment, the width Wb of the extending portions 114b is in a range from 1 μm to 7 μm. In another embodiment, the width Wb of the extending portions 114b is 5 μm.

It should be noted that the integrated circuit pads 114e of the disclosure are electrically connected with the integrated circuit 120 through the conductive layer 130. Therefore, in the embodiment, since the width We of the integrated circuit pads 114e is greater than the width Wb of the extending portions 114b, a contact area between the integrated circuit pads 114e and the conductive layer is increased. Thus, the number of conductive particles captured by the integrated circuit pads 114e is increased, so the resistance is reduced, and the conducting capability is increased.

Besides, in the embodiment, integrated circuit pads 114e of adjacent conductive wires 114 are deviated from each other. In other words, in the embodiment, from a top perspective, the integrated circuit pads 114e of the conductive wires 114 are not at the same horizontal position. Specifically, in an embodiment, a distance D1 between the integrated circuit pad 114e of one of the conductive wires 114 and the extending portion 114b of the conductive wire 114 adjacent to the one of the conductive wires 114 is in a range from 1 μm to 30 μm. In another embodiment, the distance D1 is in a range from 2 μm to 10 μm. In yet another embodiment, the distance D1 is 9 μm. In addition, in an embodiment, a distance D2 between the integrated circuit pad 114e of one of the conductive wires 114 and the integrated circuit pad 114e of the conductive wire 114 adjacent to the one of the conductive wires 114 is in a range from 1 μm to 30 μm. In another embodiment, the distance D2 is in a range from 5 μm to 28 μm. In yet another embodiment, the distance D2 is 22 μm.

It should be noted that, in the embodiment, by making the integrated circuit pads 114e of the adjacent conductive wires 114 deviated from each other, the conductive wires 114 are still disposed tightly to save the space even though the width We of the integrated circuit pads 114c is greater than the width Wb of the extending portions 114b.

Moreover, even though the width We of the integrated circuit pads 114c is greater than the width Wb of the extending portions 114b in the embodiment of FIG. 8 to increase the contact area between the integrated circuit pads 114e and the conductive layer, the disclosure is not limited thereto. In other embodiments, the width We of the integrated circuit pads 114e may also be the same as the width Wb of the extending portions 114b. Besides, in the embodiment of FIG. 8, the extending portion 114b has the uniform width Wb. However, the disclosure is not limited thereto. In other embodiments, the width of the extending portion 114b may be varied. For example, the extending portion 114b has two ends, and the width of the extending portion 114b may be gradually decreased from one end connecting the display panel pad portion 114a to the other end connecting the integrated circuit pad 114e.

Besides, in the embodiment of FIGS. 1 and 4, the insulating layer 118 is filled between the adjacent conductive wires 114 in the wiring area B of the flexible circuit board 110. However, the disclosure is not limited thereto. In other embodiments, other components may be disposed between the adjacent conductive wires 114. In the following, details in this respect will be described with reference to FIGS. 9 to 11.

Figure 9:
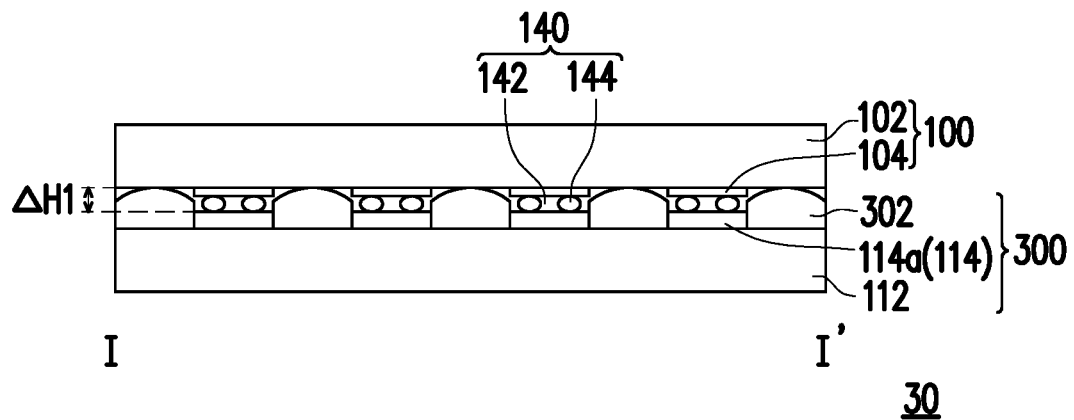
FIG. 9 is a partial schematic cross-sectional view illustrating a display device according to another embodiment of the disclosure, wherein a cross-section of FIG. 9 is based on the cross-sectional line I-I' of FIG. 1.
Figure 10:
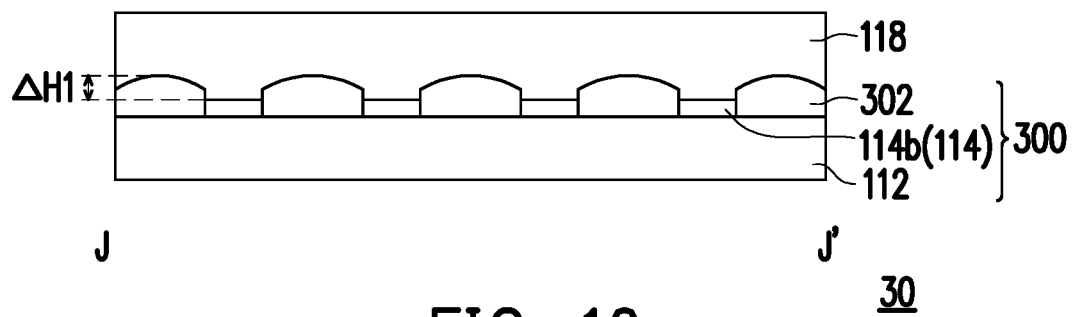
FIG. 10 is a partial schematic cross-sectional view illustrating a display device according to another embodiment of the disclosure, wherein a cross-section of FIG. 10 is based on the cross-sectional line J-J' of FIG. 1.
Figure 11:
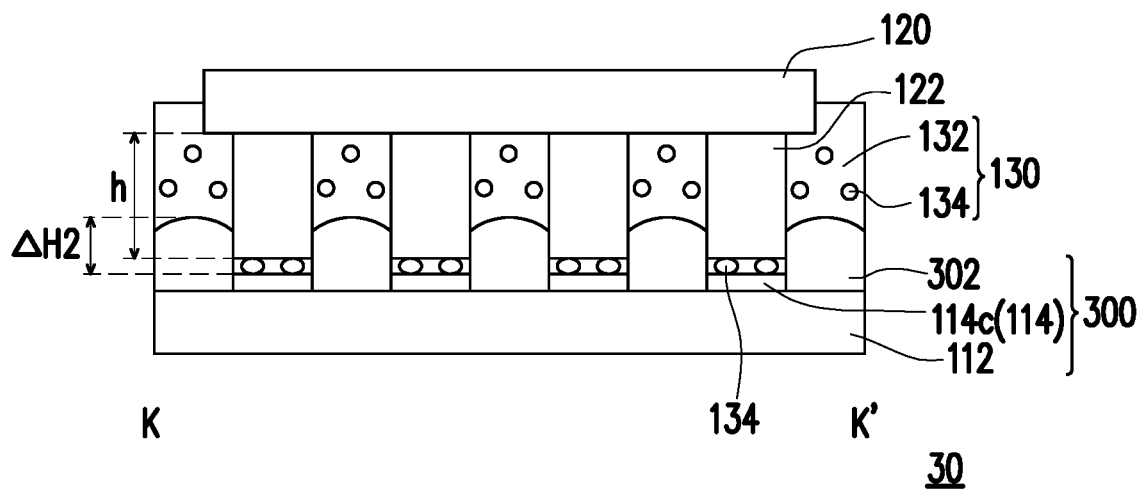
FIG. 11 is a partial schematic cross-sectional view illustrating a display device according to another embodiment of the disclosure, wherein a cross-section of FIG. 11 is based on the cross-sectional line K-K' of FIG. 1.

FIGS. 9, 10, and 11 are respectively partial schematic cross-sectional views illustrating a display device according to another embodiment of the disclosure, wherein a cross-section shown in FIG. 9 is based on the cross-sectional line I-I' of FIG. 1, a cross-section shown in FIG. 10 is based on the cross-sectional line J-J' of FIG. 1, and a cross-section shown in FIG. 11 is based on the cross-sectional line K-K' of FIG. 1. Hence, a top view of a display device 30 shown in FIGS. 9 to 11 may be referred to FIGS. 1 and 2. It should be noted that the reference numerals and a part of the contents in the previous embodiment are used in the embodiment, in which identical or similar reference numerals indicate identical or similar components, and repeated description of the same technical contents is omitted. For a detailed description of the omitted parts, reference can be found in the previous embodiment, and no repeated description is contained in the following embodiments. In the following, the description will focus on the difference between the embodiment of FIGS. 9 to 11 and the embodiment of FIGS. 1 to 5.

Referring to FIGS. 9 to 11, in the embodiment, a flexible circuit board 300 includes a plurality of spacers 302 disposed on the flexible substrate 112. Specifically, in the embodiment, as shown in FIG. 9, the spacers 302 and the display panel pad portions 114a of the conductive wires 114 are disposed alternately. As shown in FIG. 10, the spacers 302 and the extending portions 114b of the conductive wires 114 are disposed alternately. As shown in FIG. 11, the spacers 302 and the integrated circuit pads 114c of the conductive wires 114 are disposed alternately. In other words, in the embodiment, the spacers 302 are located in the integrated circuit bonding area C, the wiring area B, and the display panel bonding area A. In addition, the conductive wire 114 is located between two adjacent spacers 302. Besides, in an embodiment, the spacers 302 may extend from the integrated circuit bonding area C to the printed circuit board bonding area D through the wiring area B. Namely, the spacers 302 may be continuously disposed in the integrated circuit bonding area C, the wiring area B, and the printed circuit board bonding area D. Nevertheless, the disclosure is not limited thereto. In another embodiment, the spacers 302 may also be discontinuously distributed in the printed circuit board bonding area D, the integrated circuit bonding area C, the wiring area B, and the display panel bonding area A.

In the embodiment, the material of the spacers 302 may include an insulating material, such as (but is not limited to) a photoresist, $SiN_x$, or $SiO_x$. In the embodiment, a process of forming the spacers 302 includes performing a thin-film photolithography process, for example. It should be noted that, based on the descriptions of FIGS. 6A to 6C, people having ordinary skills in the art shall understand a process of forming the spacers 302 on the flexible substrate 112.

It should also be noted that, in the display device 30, the conductive wires 114 and the spacers 302 of the flexible circuit board 300 are formed by performing a thin-film photolithography process, such that the flexible circuit board 300 can be manufactured by using a processing technique commonly used in the manufacture of the display panel 110, and is not required to be additionally purchased. Thus, compared with the conventional display device requiring additionally purchasing the flexible circuit board during the manufacturing process, the display device 30 is more flexible in manufacturing and has a lower manufacturing cost.

In the embodiment, the thickness of the spacers 302 is greater than the thickness of the conductive wires 114 adjacent to the spacers 302. Hence, the spacers 302 are capable of preventing the conductive particles 144 in the conductive layer 140 from accumulating between the adjacent conductive wires 114, and thus the probability of short circuit occurring due to the accumulation of the conductive particles 144 between the adjacent conductive wires 114 is reduced.

Specifically, as shown in FIG. 9, there is a thickness difference $\Delta H1$ between a maximum thickness of at least one of the spacers 302 in the display panel bonding area A and a thickness of at least one of the display panel pad portions 114a of the conductive wires 114 adjacent to the at least one of the spacers 302. Specifically, in the embodiment, the thickness difference $\Delta H1$ satisfies a formula as follows: $\Delta H1 = R(1-X\%)$, wherein R is a diameter of one of the conductive particles 144, X % is a particle size compression rate of one of the conductive particles 144 (i.e., a deformation degree of the conductive particle 144 after compression), and X % is in a range from 30% to 70%. For example, in an embodiment, when the diameter of the conductive particle 144 is 3 μm, the thickness difference $\Delta H1$ is in a range from about 0.9 μm to about 2.1 μm. A formula for calculating the particle size compression rate is as follows: particle size compression rate=$(1-\sqrt{(a/b)}) \times 100\%$, wherein a is a particle diameter in a short axis of one of the conductive particles 144 after compression, and b is a particle diameter in a long axis of one of the conductive particles 144 after compression.

It should be noted that, with the thickness difference $\Delta H1$ between the spacer 302 and the display panel pad portion 114a of the conductive wire 114 adjacent to the spacer 302 in the display panel bonding area A, the space between the bonded display panel 100 and the bonded flexible circuit board 300 is controlled, and the deformation degree of the conductive particles 144 between the pads 104 of the display panel 100 and the display panel pad portions 114a after compression is controlled. Therefore, the conductive particles 144 may be prevented from cracking. In addition, in the embodiment, with the spacer 302 disposed between the adjacent conductive wires 114, the conductive particles 144 may be prevented from accumulating between the adjacent conductive wires 114, and thus the probability of short circuit occurring due to the accumulation of the conductive particles 144 between the adjacent conductive wires 114 is reduced.

Besides, as shown in FIG. 11, there is a thickness difference ΔH2 between a maximum thickness of at least one of the spacers 302 and a thickness of at least one of the integrated circuit pads 114c of the conductive wires 114 adjacent to the at least one of the spacers 302 in the integrated circuit bonding area C. Specifically, in the embodiment, the thickness difference ΔH2 satisfies a relation as follows: ¼h≤ΔH2≤½h, wherein h is a thickness of one of the bumps 122. For example, in an embodiment, when the thickness of the bump 122 is 12 μm, the thickness difference ΔH2 is in a range from 3 μm to 6 μm.

It should be noted that, in the embodiment, with the thickness difference ΔH2 between the spacer 302 and the integrated circuit pad 114c of the conductive wire 114 adjacent to the spacer 302 in the integrated circuit bonding area C, when the flexible circuit board 300 and the integrated circuit 120 are bonded, the spacer 302 may be disposed between the adjacent bumps 122 to facilitate the alignment between the integrated circuit pads 114c and the bumps 122 of the integrated circuit 120, thereby making the alignment more accurate. In addition, with the spacer 302 disposed between the adjacent conductive wires 114, the conductive particles 134 may be prevented from accumulating between the adjacent conductive wires 114, and thus the probability of short circuit occurring due to the accumulation of the conductive particles 134 between the adjacent conductive wires 114 is reduced.

Moreover, as shown in FIG. 10, there is also the thickness difference ΔH1 between the spacer 302 and the extending portion 114b of the conductive wire 114 adjacent to the spacer 302 in the wiring area B. Nevertheless, the disclosure is not limited thereto. In other embodiments, there may also be another thickness difference between the spacer 302 and the extending portion 114b of the conductive wire 114 adjacent to the spacer 302 in the wiring area B.

As shown in FIGS. 9 to 11, a top surface of the spacers 302 may have an arc-shaped profile. Nevertheless, the disclosure is not limited thereto. In other embodiments, the top surface of the spacers 302 may also have a taper-shaped profile, a trapezoid-shaped profile, or a profile in other shapes. It should be noted that, in the embodiment, with the top surface of the spacers 302 exhibiting such profiles, when the flexible circuit board 300 and the integrated circuit 120 are bonded and when the flexible circuit board 300 and the display panel 100 are bonded, the spacers 302 may facilitate the conductive particles 134 to move to positions between the bumps 122 of the integrated circuit 120 and the integrated circuit pads 114c of the flexible circuit board 300, and facilitate the conductive particles 144 to move to positions between the pads 104 of the display panel 100 and the display panel pad portions 114a of the flexible circuit board 300, thereby increasing the number of the conductive particles therebetween to reduce the resistance and enhance the conducting capability.

In view of the foregoing, the bumps of the integrated circuit are electrically connected with the conductive wires of the flexible circuit board through the conductive particles in the conductive layer, so the manufacturing cost of the display device of the disclosure is lower than that of the conventional display device. Moreover, the conductive wires of the flexible circuit board have the thickness less than or equal to 3 μm and the width in a range from 1 μm to 7 μm, so the display device of the disclosure is more applicable in small-sized electronic devices and better copes with the trend than the conventional display device. Moreover, in the manufacturing method of the display device of the disclosure, the conductive wire in the flexible circuit board is manufactured by performing a thin-film photolithography process, such that the flexible circuit board can be manufactured by using a processing technique commonly used in the manufacture the display panel, and is not required to be additionally purchased.

Accordingly, compared with the conventional display device requiring additionally purchasing the flexible circuit board, the display device manufactured according to the manufacturing method of the display device of the disclosure is more flexible in manufacturing and has a lower manufacturing cost. Besides, the two embodiments for the flexible circuit board proposed in the disclosure may be used in combination in the display device of the disclosure. In other words, the spacer may be disposed between the adjacent conductive wires in a portion of the area of the flexible circuit board and not disposed in the rest of the area of the flexible circuit board.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A display device, comprising:
   a display panel;
   a flexible circuit board, electrically connected with the display panel, and the flexible circuit board comprising a plurality of conductive wires, and a plurality of spacers, wherein the spacers and the conductive wires are disposed alternately, and a thickness of at least one of the spacers is greater than a thickness of at least one of the conductive wires adjacent to the at least one of the spacers;
   an integrated circuit, disposed on the flexible circuit board, and the integrated circuit having a plurality of bumps; and
   a conductive layer, disposed between the integrated circuit and the flexible circuit board, and the conductive layer comprising an adhesive and a plurality of conductive particles distributed in the adhesive, wherein the bumps are electrically connected with the conductive wires through the conductive particles,
   wherein the flexible circuit board comprises a display panel bonding area, an integrated circuit bonding area, and a wiring area, and the wiring area is located at a side of the display panel bonding area and surrounds the integrated circuit bonding area, and
   a thickness difference ΔH2 between the at least one of the spacers in the integrated circuit bonding area and at least one of the conductive wires adjacent to the at least one of the spacers satisfies a relation as follows: ¼h≤ΔH2≤½h, wherein h is a thickness of one of the bumps.

2. The display device as claimed in claim 1, wherein a thickness of at least one of the conductive wires is less than or equal to 3 μm.

3. The display device as claimed in claim 1, wherein the conductive wires extend from the integrated circuit bonding area to the display panel bonding area through the wiring area.

4. The display device as claimed in claim 1, wherein at least one of the conductive wires comprises an integrated circuit pad and an extending portion connected with the integrated circuit pad, the integrated circuit pad is located in the integrated circuit bonding area, and a width of the integrated circuit pad is greater than a width of the extending portion, wherein the width of the integrated circuit pad is in a range from 3 μm to 20 μm, and the width of the extending portion is in a range from 1 μm to 7 μm.

5. The display device as claimed in claim 4, wherein a plurality of conductive paths are separately located between at least one of the bumps and the integrated circuit pad is discontinuous.

6. The display device as claimed in claim 1, wherein a thickness difference $\Delta H1$ between the at least one of the spacers in the display panel bonding area and at least one of the conductive wires adjacent to the at least one of the spacers satisfies a formula as follows: $\Delta H1=R(1-X\%)$, wherein R is a diameter of one of the conductive particles, X % is a particle size compression rate of one of the conductive particles, and X % is in a range from 30% to 70%.

7. The display device as claimed in claim 1, wherein the flexible circuit board further comprises an insulating layer disposed in the wiring area, and the insulating layer covers the conductive wires.

* * * * *